(12) United States Patent
In et al.

(10) Patent No.: US 8,049,486 B1
(45) Date of Patent: Nov. 1, 2011

(54) COUPLED ELECTRIC FIELD SENSORS FOR DC TARGET ELECTRIC FIELD DETECTION

(75) Inventors: Visarath In, Chula Vista, CA (US); Adi R. Bulsara, San Diego, CA (US); Yong (Andy) An Kho, Chula Vista, CA (US); Antonio Palacios, San Diego, CA (US); Salvatore Baglio, Catania (IT); Bruno Ando, Catania (IT)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 729 days.

(21) Appl. No.: 12/175,262

(22) Filed: Jul. 17, 2008

(51) Int. Cl.
*G01R 31/02* (2006.01)
*G01R 29/12* (2006.01)

(52) U.S. Cl. .......................... 324/72; 324/457
(58) Field of Classification Search .................. 324/72, 324/457
See application file for complete search history.

(56) References Cited

U.S. PATENT DOCUMENTS

| | | | |
|---|---|---|---|
| 3,760,268 A * | 9/1973 | Ruhnke | 324/72 |
| 6,051,967 A * | 4/2000 | Draaijer | 324/72 |
| 6,222,423 B1 | 4/2001 | Sudjian | |
| 6,714,469 B2 | 3/2004 | Rickes et al. | |
| 6,785,629 B2 | 8/2004 | Rickes et al. | |
| 7,154,768 B2 | 12/2006 | Chen et al. | |

OTHER PUBLICATIONS

Non-Published U.S. Appl. No. 10/874,009, filed Jun. 18, 2004, titled "Coupled Nonlinear Sensor System"(recently allowed).
Non-Published U.S. Appl. No. 11/732,678, filed Apr. 4, 2007, titled "Coupled nonlinear sensor system for sensing a time-dependent target signal and method of assembling the system" (pending).
Non-Published U.S. Appl. No. 11/858,966, filed Sep. 21, 2007, titled "Coupled Fluxgate Magnetometers for DC and Time-Varying Target Magnetic Field Detection." (pending).
A. Bulsara, V. In, A. Kho, P. Longhini, A. Palacios, W-J. Rappel, J. Acebron, S. Baglio, and B. Ando Emergent oscillations in unidirectionally coupled overdamped bistable systems. Phys. Rev. E 70, 036103-1-12 (2004).
V. In, A. Bulsara, A. Palacios, P. Longhini, A. Kho, and J. Neff. Coupling-induced oscillations in overdamped bistable systems. Physical Review E 68, Rapid Communication (2003) 045102-1.
A. Palacios, J. Aven, V. In, P. Longhini, A. Kho, J. Neff, and A. Bulsara. Coupled-core fluxgate magnetometer: Novel configuration scheme and the effects of a noise-contaminated external signal. Physics Letters A 367, 25-34 (2007).
V. In, A. Kho, A. Bulsara, J. Neff, S. Baglio, V. Sacco, A. Palacios, and P. Longhini. Coupling nonlinear sensors for enhanced sensitivity: A prototype using the three coupled-core fluxgate magnetometer. Proceedings of the 4th IEEE Conference on Sensors. Irvine, CA, Mar. (2006) 57-60.

(Continued)

*Primary Examiner* — Amy He
(74) *Attorney, Agent, or Firm* — Kyle Eppele; J. Eric Anderson (57) ABSTRACT

In various embodiments, an apparatus for detecting electric fields is disclosed that includes an array of non-linear elements configured into an oscillator with each coupled to one or more electric-field sensing plates. In various embodiments, an output of the array produces a frequency that varies as a function of an electric field sensed by the one or more electric-field sensing plates.

8 Claims, 6 Drawing Sheets

OTHER PUBLICATIONS

A. Palacios, R. Carretero-Gonzalez, P. Longhini, N. Renz, V. In, A. Kho, J. Neff, B. Meadows, and A. Bulsara. Multifrequency synthesis using two coupled nonlinear oscillator arrays. Physical Review E 72, 026211 (2005).

Visarath In, Andy Kho, Joseph D. Neff, Antonio Palacios, Patrick Longhini, and Brian K. Meadows. Experimental Observation of Multifrequency Patterns in Arrays of Coupled Nonlinear Oscillators; Physical Review Letters vol. 91, No. 24. (2003).

Visarath In, Adi Bulsara, Andy Kho, Antonio Palacios, Patrick Longhini, Juan Acebron, Salvatore Aglio and Bruno Ando. Self-Induced Oscillations in Electronically-Coupled Fluxgate Magnetometers; Experimental Chaos: 8th Experimental Chaos Conference. AIP Conference Proceedings, vol. 742, pp. 57-62 (2004).

A. Bulsara, J.F. Lindner, V. In, A. Kho, S. Baglio, V. Sacco, B. Ando, P. Longhini, A. Palacios, and W. J. Rappel. Coupling-Induced cooperative behavior in dynamic ferromagnetic cores in the presence of a noise floor. Physics Letters A 353 4-10 (2006).

V. In, A. Bulsara, A. Kho, A. Palacios, S. Baglio, B. Ando, and V. Sacco. Dynamic cooperative behavior in a coupled-core fluxgate magnetometer. IEEE, ICAS 2006, 0-7-7803-9390-2/06, 5171-5174 (2006).

Visarath in, Andy Kho, Adi R. Bulsara, Joseph D. Neff, Salvatore Baglio, Vincenzo Sacco, Antonio Palacios, and Patrick Longhini. Coupling Nonlinear Sensors for Enhanced Sensitivity: A Prototype Using the 3 Coupled-Core Fluxgate Magnetometer; IEEE 0-7803-9056-3/05; 57-60 (2005).

Visarath in, Andy Kho, Adi .R. Bulsara, Antonio Palacios, Salvatore Baglio, B. Ando, Patrick Longhini, Joseph D. Neff, Brian K. Meadows. Self-Induced Oscillations in Coupled Fluxgate Magnetometer: A Novel Approach to Operating the Magnetic Sensors; IEEE, ICAS 2004, 0-7803-8251-X/04, 736-739 (2004).

* cited by examiner

COUPLED ELECTRIC FIELD SENSORS FOR DC TARGET ELECTRIC FIELD DETECTION

FEDERALLY SPONSORED RESEARCH AND DEVELOPMENT

This invention (Navy Case No. 099023) is assigned to the United States Government and is available for licensing for commercial purposes. Licensing and technical inquiries may be directed to the Office of Research and Technical Applications, Space and Naval Warfare Systems Center, San Diego, Code 2112, San Diego, Calif., 92152; voice 619-553-2778; email T2@spawar.navy.mil.

CROSS REFERENCE TO RELATED APPLICATIONS

This application is related to U.S. patent application Ser. No. 10/874,009, pending, entitled "Coupled Nonlinear Sensor System," (Navy Case 95759); U.S. patent application Ser. No. 11/858,966, pending, entitled "Coupled Fluxgate Magnetometers for DC and Time Varying Target Magnetic Field Detection," (Navy Case 97071); and U.S. patent application Ser. No. 11/732,678, pending, entitled "Coupled Nonlinear Sensor System for Sending a Time-Dependent Target Signal and Method of Assembling the System," (Navy Case 96761).

BACKGROUND

I. Field

This disclosure relates to systems and methods for detecting electric fields.

II. Background

Electric-field sensors ("E-sensors") are devices that are used for a variety of purposes, such as the detection and ranging of ships and other vehicles, oceanographic studies and geophysical measurements and prospecting.

Current E-sensors generally rely on the measurement of a voltage drop across two electrodes implanted in a conducting medium. However, for all the known electrically active materials that can be used in an E-sensor, the relative coercive field (this determines the energy barrier height separating the states of stable electrical polarization) can be prohibitively large. Accordingly, new technology related to E-sensors may be desirable.

SUMMARY

Various aspects and embodiments of the invention are described in further detail below.

In a first series of embodiments, an apparatus for detecting electric fields includes an array of non-linear elements configured into an oscillator with each coupled to one or more electric-field sensing plates, wherein an output of the array produces a frequency that varies as a function of an electric field sensed by the one or more electric-field sensing plates.

In another series of embodiments, an apparatus for detecting electric fields includes one or more electric-field sensing plates, and a plurality of non-linear detection means serially configured into an oscillator with each non-linear detection means coupled to the one or more electric-field sensing plates, and wherein an output of at least of the one non-linear detection means produces a frequency that varies as a function of an electric field sensed by the one or more electric-field sensing plates.

BRIEF DESCRIPTION OF THE DRAWINGS

The features and nature of the present disclosure will become more apparent from the detailed description set forth below when taken in conjunction with the accompanying drawings in which reference characters identify corresponding items.

DETAILED DESCRIPTION

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

This disclosure is based on the generation of internal oscillations in coupled nonlinear dynamic systems that do not normally (i.e., absent the coupling), oscillate. The system consists of coupled nonlinear electric field sensors ("E-sensors"), and is operated as a residence time domain detector. The frequency and other dynamical characteristics of the emergent oscillations depend on the system and target signal parameters. Hence, the system can be used to detect and/or quantify very weak dc or even time dependent (ac) target signals.

Details of the emergent oscillatory behavior, which emerges even in the absence of any external target signal if one adjusts the coupling strength past its critical value, for the case of dc target signals, may be found in "Exploiting Dynamical Symmetry in Coupled Nonlinear Elements for Efficient Frequency Down-Conversion" by Visarath In, Adi R. Bulsara and Antonio Palacios, a copy of which is attached in the Following Appendix (Appendix A)

In this disclosure, the plans and back ground theory underlying the first working device are described, consisting of 3 or more planar E-sensors, to exploit the emergent oscillation behavior as a result of broken symmetry. The resultant device is compact, very inexpensive, and potentially far more sensitive than its single element counterpart.

Figure 1:
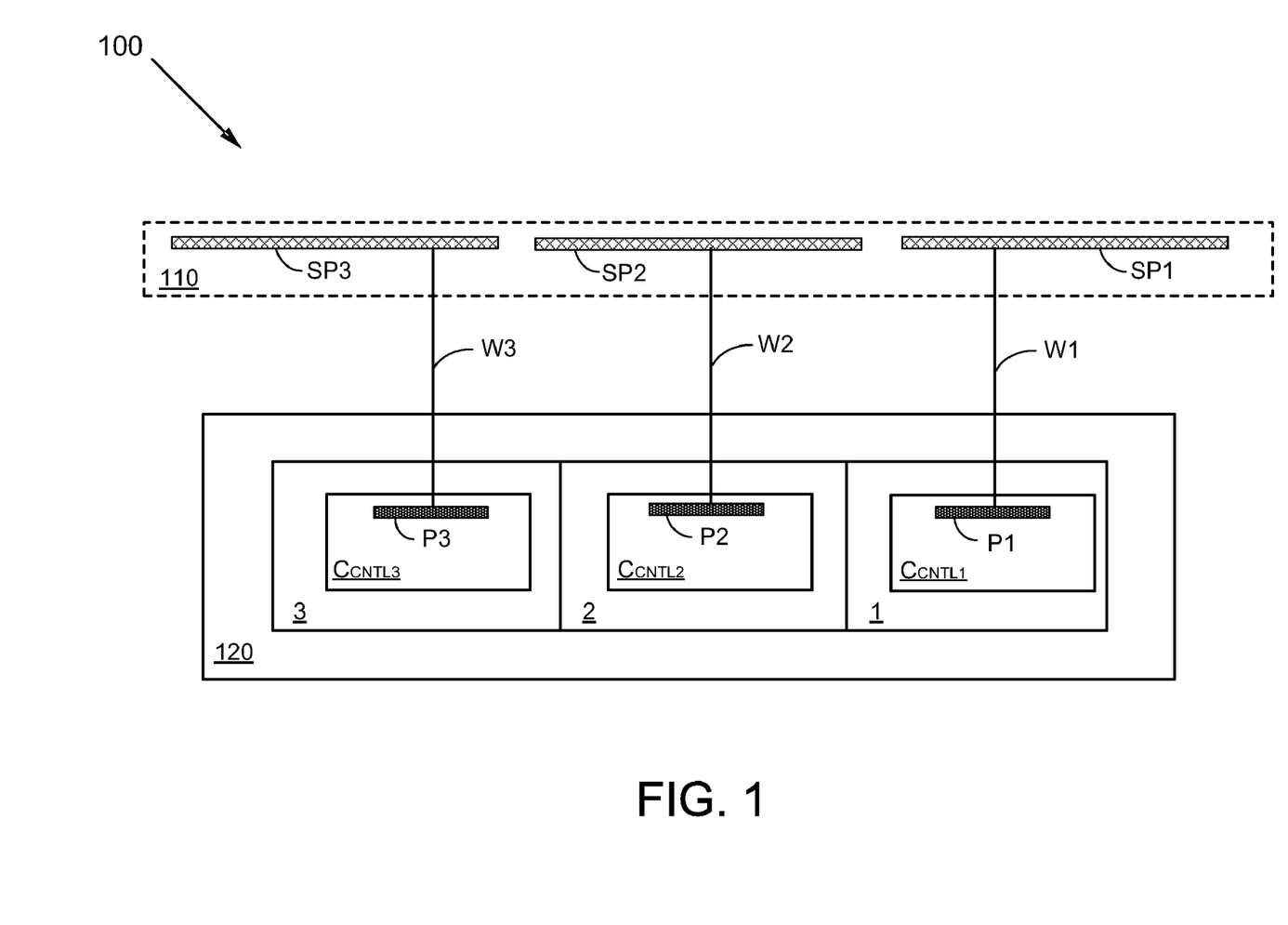
FIG. 1 is an exemplary electric field detection system.

FIG. 1 is an exemplary E-sensor 100. As shown in FIG. 1, the exemplary coupled E-sensor 100 includes a sensing array 110 that includes sensing plates SP1, SP2 and SP3 each coupled to respective control plates P1, P2 and P3 via wires W1, W2 and W3. Each of the control plates P1, P2 and P3 is part of a respective control capacitor $C_{CNTL1}$, $C_{CNTL2}$, and $C_{CNTL3}$, and each control capacitor $C_{CNTL1}$, $C_{CNTL2}$, and $C_{CNTL3}$ is part of a respective inverting circuit element 1, 2 and 3, which in turn are part of a processing system 120 of electronic (and other) components.

In operation, an electric field interacting with sensing plates SP1, SP2 and SP3 can cause a charge to reach the respective control plates P1, P2 and P3. While it may be possible to use a single sensing plate to feed all of the control plates P1, P2 and P3, such a configuration can lead to coupling problems between the control capacitors $C_{CNTL1}$, $C_{CNTL2}$, and $C_{CNTL3}$, as well as require the charge of a single sensing plate to be distributed among multiple control plates.

Continuing, the charged control plates P1, P2 and P3 can cause changes in the properties of their respective control capacitors $C_{CNTL1}$, $C_{CNTL2}$, and $C_{CNTL3}$, which in turn can cause an oscillating pattern created by circuit elements 1, 2 and 3 to vary as will be explained further below.

Note that it can be useful to exploit a well known electrostatic effect, i.e., the principle of Voltas electrometer, together with the well known charge density amplification detectable on an irregular surface as a function of the curvature radius, to achieve electric field amplification. Assuming a given charge quantity induced by an external electric field on a sensing plate, the same amount of charge but with opposite sign will distribute onto the control plate. If the surface of this latter control plate is considerably smaller than that of the sensing plate, a higher surface charge density will be observed. Thus, a proportional amplification of the corresponding electric field, as localized on the collecting plate, is obtained.

This theoretical concept can be easily extended to a structure composed of two electrically connected conducting plates, such as plates P1 and SP1 shown in FIG. 1. In this setup, significant charge density amplification can be observed on a control plate P1, whose area can be 1 ppm with respect to that of the sensing plate SP1, thereby exploiting miniaturization capabilities obtainable by means of micromachining techniques.

Figure 2:
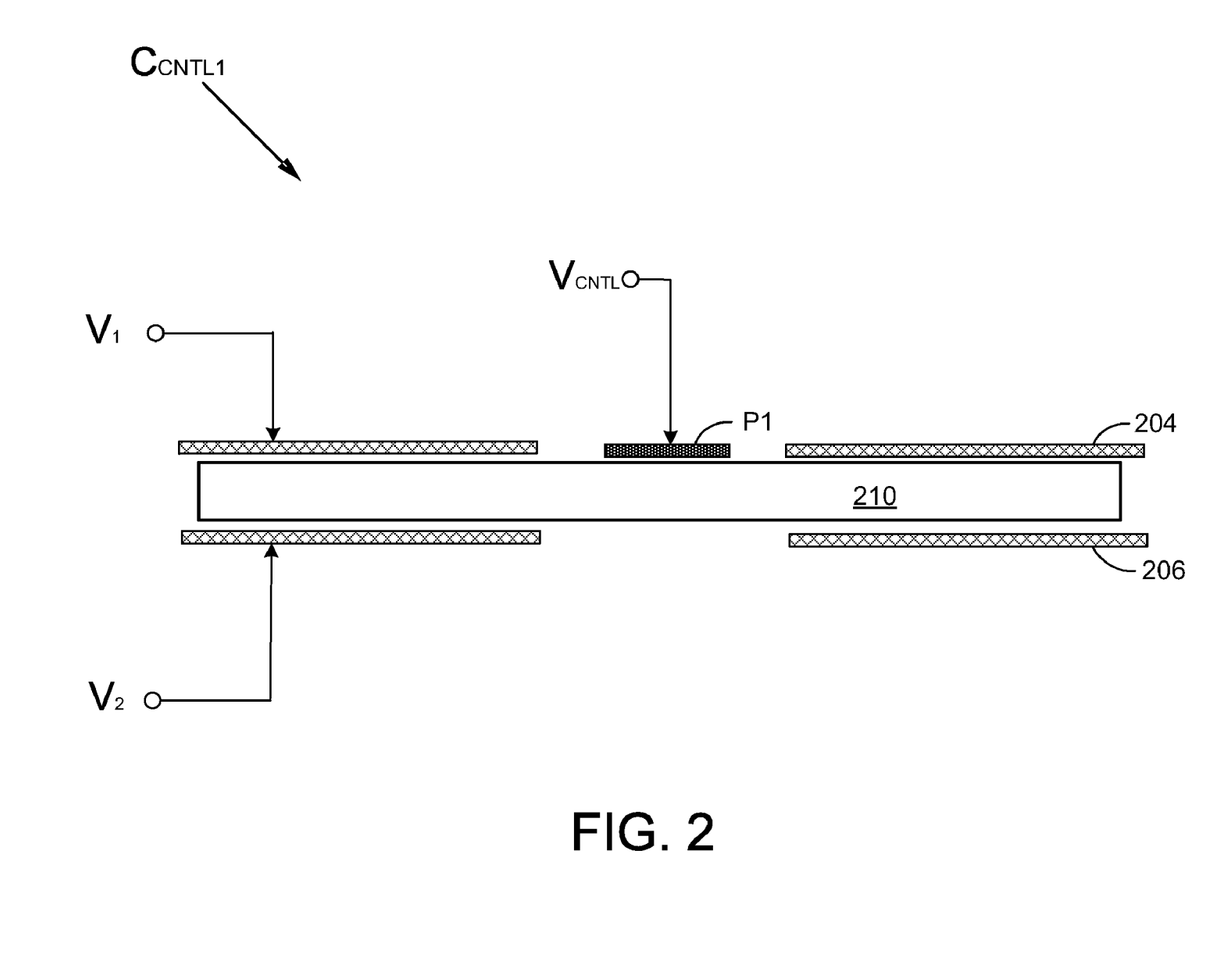
FIG. 2 depicts a cross-sectional view of an exemplary controllable capacitor used in the electric field detection system of FIG. 1.
Figure 3:
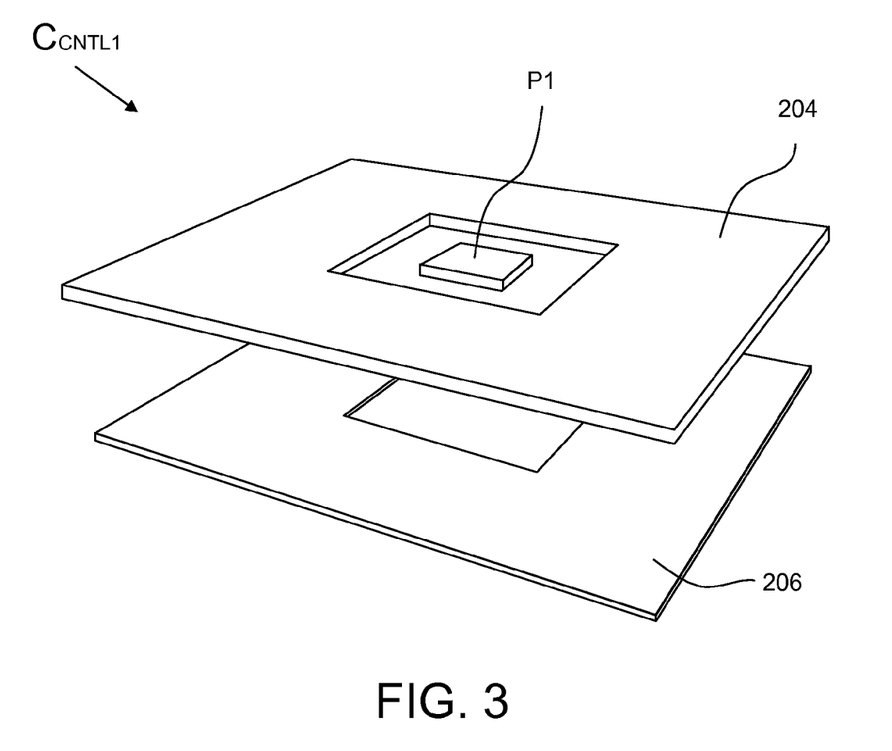
FIG. 3 depicts an oblique view of the exemplary controllable capacitor of FIG. 2.

FIG. 2 depicts an exemplary configuration of control capacitor $C_{CNTL1}$. As shown in FIG. 2, the exemplary control capacitor $C_{CNTL1}$ includes control plate P1 surrounded by two toroidal plates 204 and 206, which can act as a variable capacitor between nodes $V_1$ and $V_2$ as a function of control voltage $V_{CNTL}$, which presumably may come from a sensing plate such as those depicted in FIG. 1. Ferroelectric material 210 is placed between the toroidal plates 204 and 206 and below the control plate P1. FIG. 3 depicts a three-dimensional view of control capacitor $C_{CNTL}$ for better understanding of the exemplary (but non-limiting) geometry used in the present example.

A technological issue to be addressed is the realization of a integrated ferroelectric capacitor in which electrode/plate P1 is configured to polarize that part of the capacitor's ferroelectric material located in the center of 204 and 206 (e.g., that material directly below plate P1 of FIG. 2), while avoiding polarization of the ferroelectric material directly between plates 204 and 206 shielded by the target electric field incident of the capacitor. Integrated ferroelectric capacitors in standard technology (e.g. CMOS) have been extensively developed in the past decade; the approach proposed here is to realize a pair of pierced electrodes with a geometry conceived to exploit the boundary effect at the hole to polarize the ferroelectric material therein. Finite element analysis has been used in the run-up to this proposal, in conceiving the mechanical structure, and analyzing the electric field interactions in the system.

If a sinusoidal bias field is imposed to the ferroelectric material 210 through the capacitor's toroidal electrodes 204 and 206, an ideal rectangular wave can occur at the output of a circuit using such a capacitor, due to the bistable behavior of the system. The action of an external electric field, which can be added to the bias field, can induce a change in the duty cycle of the output signal.

Figure 4:
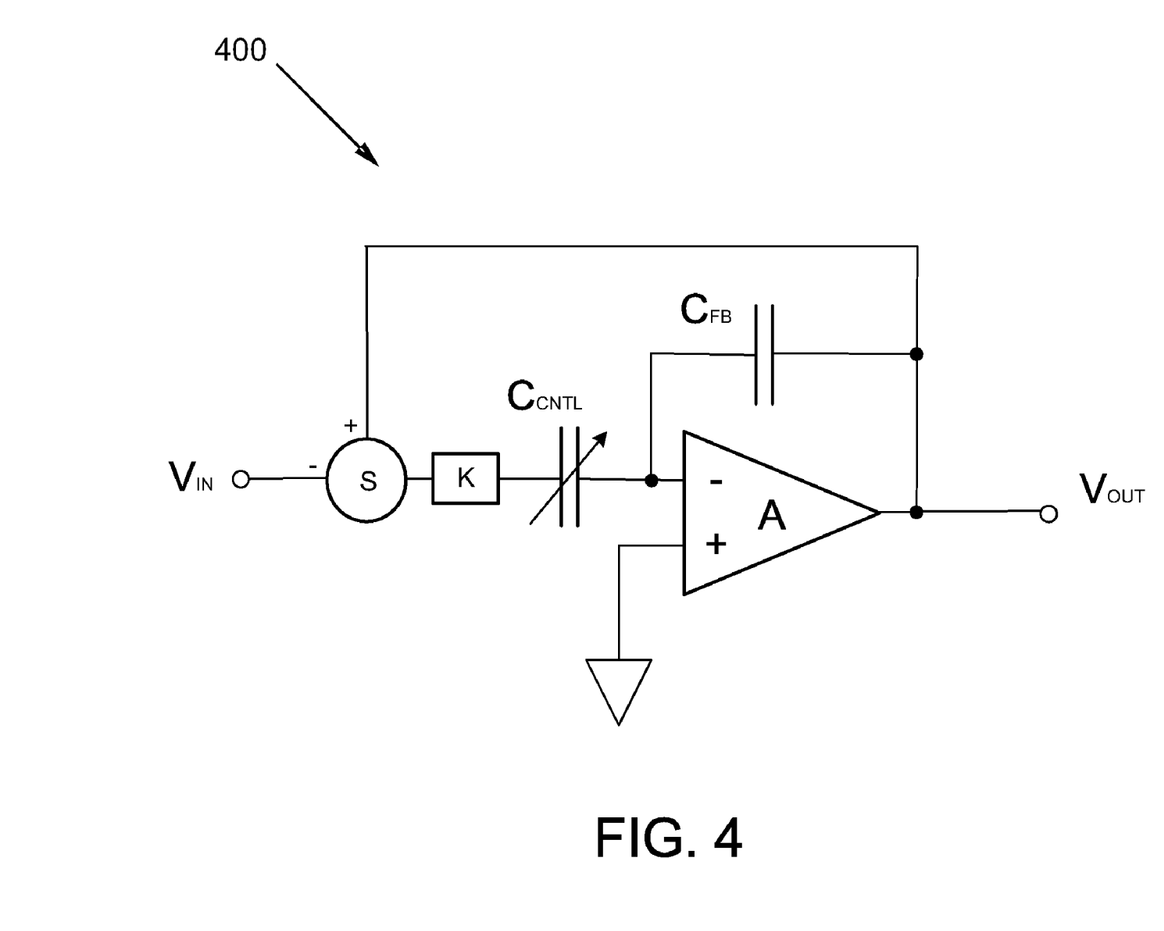
FIG. 4 is an exemplary circuit element employing the controllable capacitor of FIGS. 2 and 3.

FIG. 4 depicts a single E-sensor circuit element 400. As shown in FIG. 4, the E-sensor element 400 includes an amplifier A having an inner-loop feedback capacitor $C_{FB}$, a feed-forward control capacitor $C_{CNTL}$, gain stage K, and summing junction S.

In operation, an input voltage $V_{IN}$ can be applied to summing junction S along with feedback from the output of amplifier A ($V_{OUT}$) with the difference being provided to gain stage K. The output of gain stage K can then be applied to the feed-forward control capacitor $C_{CNTL}$ and inner-loop feedback capacitor $C_{FB}$ to affect the output of amplifier A ($V_{OUT}$). Note that the feed-forward control capacitor $C_{CNTL}$ is controllable and changes in its properties can affect the overall transfer function of the E-sensor element 400.

A single E-sensor can be treated as a nonlinear dynamic system by writing down an equation for the evolution of the (suitably normalized) macroscopic polarization parameter $x(t)$:$\dot{x}(t) = -\nabla_x U(x)$ in terms of the potential energy function.

$$U(x,t) = -ax^2/2 + bx^4/4 - c\epsilon x. \qquad \text{Eq. (1)}$$

Here, (a, b, c) are system (material dependent) parameters which can control the topology of the potential function, the "overdot" variable denotes the time-derivative, and $\epsilon$ is an external (target) dc signal.

Figure 5:
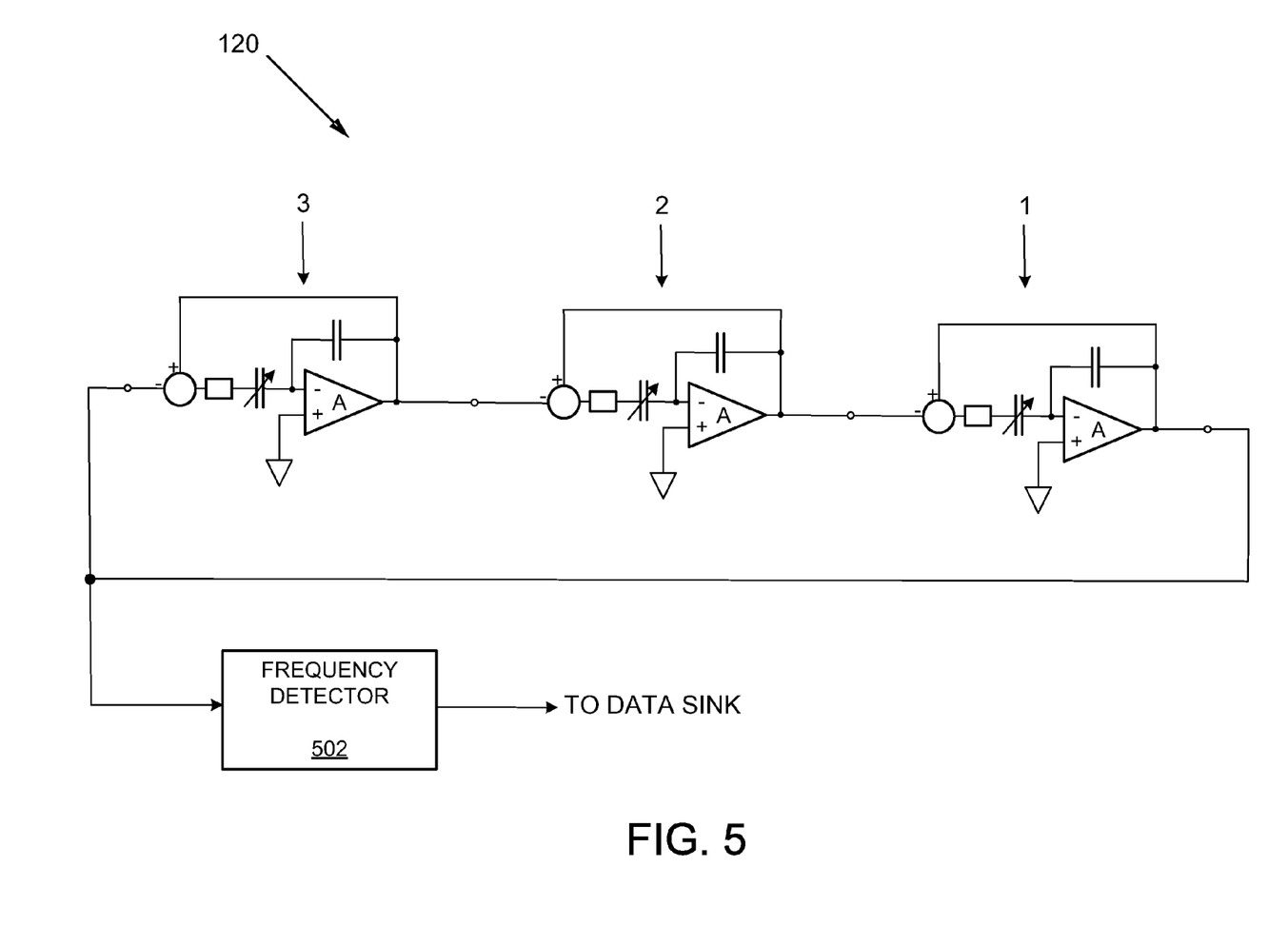
FIG. 5 is an exemplary processing system employing the circuit elements of FIG. 4.

FIG. 5 depicts details of the three circuit elements 1, 2 and 3 coupled together to form a unidirectional coupled oscillator, with the output of circuit element 1 fed to a frequency detector 502 noting that the unidirectional coupled oscillator can produce a frequency output highly sensitive to electric fields while the frequency detector 502 can be used to translate a time domain wavefront into some equivalent representation of the sensed electric field.

At least two advantages arise from the possibility of exploiting the oscillating frequency change in the presence of the electric field, including:

Reason (1): Conventional E-sensors rely on the measurement of a voltage drop across two electrodes implanted in the conducting medium. The reason is that in all the known electrically active materials that can be used in the sensor, the coercive field (this determines the energy barrier height separating the states of stable electrical polarization) is prohibitively large, so that a single E sensor, operated in the manner of a single micro-fluxgate, would need a prohibitively large onboard bias signal to generate switching events between the stable steady states of the material. This limitation is overcome by designing the system of coupled E-sensors, which is set up to oscillate when a control parameter (in this case an electrical coupling) is tuned past a threshold value. In essence, the oscillatory behavior overcomes the coercive field at each core so that, once the oscillations have begun, the effect of a change in the ambient E field is to cause a change in the residence times difference of the output voltage signal, which can be measured directly on the (coupled) device.

Reason (2): The possibility of implementing a measurement system based on the frequency that holds out the promise of low cost digital electronics (i.e. digital counters) that operate at very high frequency, and hence afford high resolution in the estimation of the system oscillation frequency.

Returning to FIG. 5, to understand the dynamics of the three circuit elements 1, 2 and 3, the following equations are used:

$$\dot{x}_1 = ax_1 - bx_1^3 + \lambda(x_1 - x_2) + c\epsilon \qquad \text{Eq. (2)}$$

$$\dot{x}_2 = ax_2 - bx_2^3 + \lambda(x_2 - x_3) + c\epsilon \qquad \text{Eq. (3)}$$

$$\dot{x}_3 = ax_3 - bx_3^3 + \lambda(x_3 - x_1) + c\epsilon \qquad \text{Eq. (4)}$$

where the parameters have already been defined.

It is useful to note that the oscillatory behavior occurs even for $\epsilon = 0$, however when $\epsilon \neq 0$, the oscillation characteristics change as a function of $\epsilon$; these changes can be exploited for signal quantification purposes.

Under the above conditions, the system of FIG. 5 can display oscillatory behavior with the following features:

Feature (1): The oscillations commence when the coupling coefficient exceeds a threshold value:

$$\lambda_c = \frac{a}{2} + \frac{5}{3}\sqrt{\frac{b}{2a}}\,c\varepsilon \qquad \text{Eq. (5)}$$

Feature (2): The individual oscillations (in each elemental response) are separated in phase by $2\pi/N$, and have period $T_i = t_1 + t_2$ where $t_{1,2}$ are theoretically computed as:

$$t_1 = N\pi/\sqrt{|3bx_{10}f(x_{10})|} \qquad \text{Eq. (6)}$$

$$t_12 = N\pi/\sqrt{|3bx_{30}f(x_{30})|} \qquad \text{Eq. (7)}$$

where $$x_{10} = -x_{30} = \sqrt{(a+\lambda)/3b} \qquad \text{Eq. (8)}$$

and introduce the definitions:

$$f(x_{10}) = (a+\lambda)x_{10} - bx_{10}^3 - \lambda x_{2m} + c\varepsilon \qquad \text{Eq. (9)}$$

$$f(x_{30}) = (a+\lambda)x_{30} - bx_{30}^3 - \lambda x_{2m} + c\varepsilon \qquad \text{Eq. (10)}$$

where $$x_{2m} = \sqrt{(a+2\lambda)/b} - \left(\frac{c\varepsilon}{(2a+4\lambda)}\right) \qquad \text{Eq. (11)}$$

Feature (3): The summed output oscillates at period $T_+ = T_i/N$ and its amplitude (as well as that of each elemental oscillation) is always suprathreshold (i.e. greater than the energy barrier height $U_0$ of each individual uncoupled element). Thus the emergent oscillations are strong enough to drive each core between its saturation states, eliminating the need to apply any additional bias signals. Increasing N changes the frequency of the individual elemental oscillations, but the frequency of the summed response is seen to be independent of N.

Reason (4): The residence times difference, i.e. the difference in the times spent by the system in its two stable magnetization states, can be computed as $\Delta t = t_1 - t_2$, which vanishes for $\varepsilon = 0$, and can be used as a quantifier of the target signal, analogous to the time-domain operation of the single fluxgate.

Figure 6:
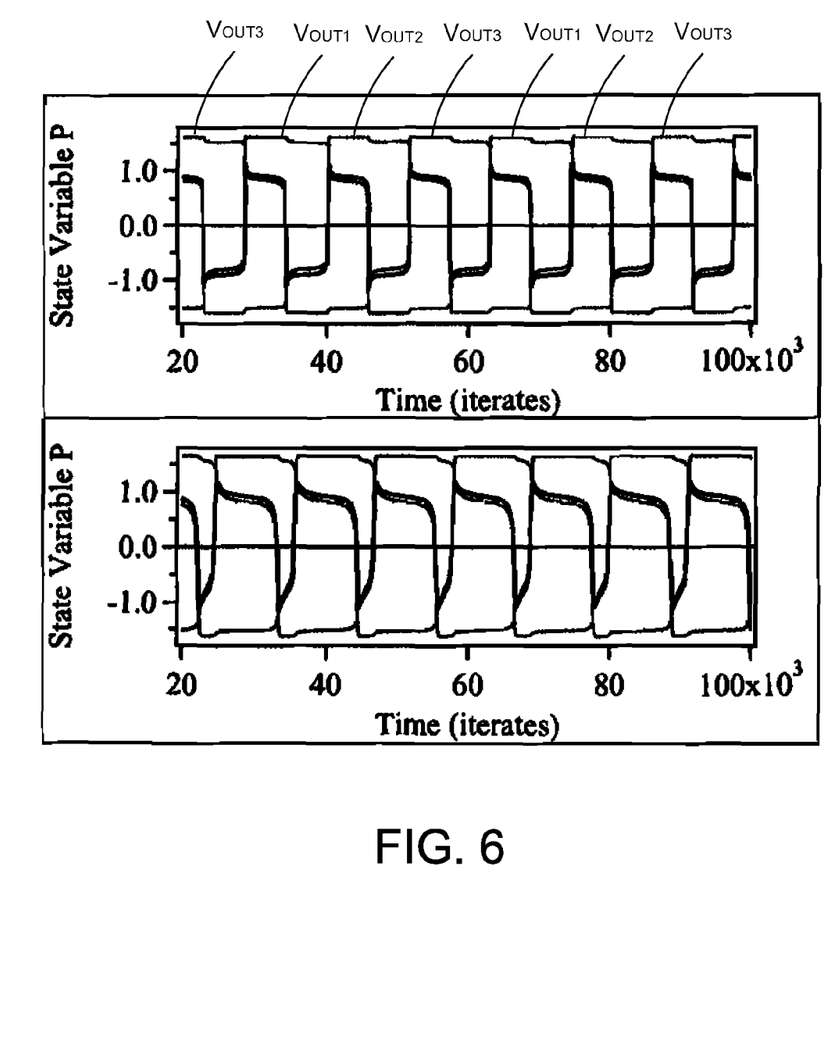
FIG. 6 depicts output states for the various oscillating elements of FIG. 5

Reason (5): The system responsivity, defined via the derivative $\partial \Delta t/\partial \varepsilon$, is found to increase dramatically as one approaches the critical point in the oscillatory regime; which suggests that careful tuning of the coupling parameter so that the oscillations have very low frequency could offer significant benefits for the detection of very small target signals. Note that FIG. 6 depicts output states for the various oscillating elements of FIG. 5.

In various embodiments where the above-described systems and/or methods are implemented using a programmable device, such as a computer-based system or programmable logic, it should be appreciated that the above-described systems and methods can be implemented using any of various known or later developed programming languages, such as "C", "C++", "FORTRAN", Pascal", "VHDL" and the like.

Accordingly, various storage media, such as magnetic computer disks, optical disks, electronic memories and the like, can be prepared that can contain information that can direct a device, such as a computer, to implement the above-described systems and/or methods. Once an appropriate device has access to the information and programs contained on the storage media, the storage media can provide the information and programs to the device, thus enabling the device to perform the above-described systems and/or methods.

For example, if a computer disk containing appropriate materials, such as a source file, an object file, an executable file or the like, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods and coordinate the functions of the individual systems and/or methods related to communications.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An apparatus for detecting electric fields, comprising:
an array of an odd number of non-linear elements configured into an oscillator with each element coupled to a separate electric-field sensing plate, wherein an output of the array produces a frequency that varies as a function of an electric field sensed by the one or more electric-field sensing plates; and
wherein each element includes a control capacitor coupled to a respective sensing plate.

2. The apparatus of claim 1, wherein each control capacitor has a toroidal configuration.

3. The apparatus of claim 1, wherein each control capacitor has a control node configured to utilize charge density amplification to achieve electric field amplification.

4. The apparatus of claim 1, wherein each nonlinear element further comprises:
an amplifier configured to receive an output of the control capacitor and to produce an output voltage;
an inner-loop feedback capacitor configured to receive the output voltage and to provide a feedback signal as an input to the amplifier;
a gain stage, the output of which is operatively coupled to an input of the control capacitor; and
a summing junction configured to provide as an input to the gain stage, the difference between the output voltage and an input voltage.

5. An apparatus for detecting electric fields, comprising:
an odd number of electric-field sensing plates;
an odd number of non-linear detection means serially configured into an oscillator with each non-linear detection means coupled to a separate electric-field sensing plate, and wherein an output of at least of the one non-linear detection means produces a frequency that varies as a function of an electric field sensed by the one or more electric-field sensing plates;

wherein each detection means includes a capacitive control means coupled to a respective sensing plate.

6. The apparatus of claim 5, wherein each capacitive control means has a toroidal configuration.

7. The apparatus of claim 6, wherein each capacitive control means has a control node configured to utilize charge density amplification to achieve electric field amplification.

8. The apparatus of claim 5, wherein each nonlinear detection means further comprises:

an amplifier configured to receive an output of the capacitive control means and to produce an output voltage;

an inner-loop feedback capacitor configured to receive the output voltage and to provide a feedback signal as an input to the amplifier;

a gain stage, the output of which is operatively coupled to an input of the capacitive control means; and a summing junction configured to provide as an input to the gain stage, the difference between the output voltage and an input voltage.

* * * * *